(12) United States Patent
Kawashima et al.

(10) Patent No.: US 11,327,093 B2
(45) Date of Patent: May 10, 2022

(54) INTERPOSER, SOCKET, SOCKET ASSEMBLY, AND WIRING BOARD ASSEMBLY

(71) Applicant: ADVANTEST Corporation, Tokyo (JP)

(72) Inventors: Takashi Kawashima, Tokyo (JP); Akihiko Ito, Tokyo (JP); Keishi Oku, Tokyo (JP); Natsuki Shiota, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 49 days.

(21) Appl. No.: 16/742,982

(22) Filed: Jan. 15, 2020

(65) Prior Publication Data

US 2020/0300890 A1    Sep. 24, 2020

(30) Foreign Application Priority Data

Mar. 20, 2019 (JP) .............................. JP2019-053516

(51) Int. Cl.
*G01R 1/04* (2006.01)
*G01R 1/067* (2006.01)
(Continued)

(52) U.S. Cl.
CPC ......... *G01R 1/0433* (2013.01); *G01R 1/0416* (2013.01); *G01R 31/2889* (2013.01); *H01L 23/49811* (2013.01); *H01L 24/45* (2013.01)

(58) Field of Classification Search
CPC ........ G01R 1/04; G01R 1/0433; G01R 1/067; G01R 1/073; G01R 1/07378;
(Continued)

(56) References Cited

U.S. PATENT DOCUMENTS

| 2007/0001692 A1* | 1/2007 | Yamada ............. G01R 1/06722 324/750.09 |
| 2009/0219043 A1* | 9/2009 | Nakayama ......... G01R 31/2889 324/762.05 |
| 2013/0330945 A1 | 12/2013 | Chang et al. |

FOREIGN PATENT DOCUMENTS

| JP | 2003050262 A | 2/2003 |
| JP | 2007012475 A | 1/2007 |

(Continued)

OTHER PUBLICATIONS

Office Action issued in the counterpart Taiwanese Patent Application No. 109100296, dated Feb. 9, 2021 (8 pages).
(Continued)

*Primary Examiner* — Neel D Shah
(74) *Attorney, Agent, or Firm* — Osha Bergman Watanabe & Burton LLP

(57) ABSTRACT

The socket 20 comprises a first contact probe 21 which has a first end which is to contact with a first terminal 91 of the DUT 90, a second contact probe 22 which has a second end which is to contact with a second terminal 92 of the DUT 90, and an inner housing 23 which holds the first and second contact probes 21, 22 so that the first end and the second end are located on substantially the same virtual plane VP, and the length $L_2$ of the second contact probe 22 is shorter than the length $L_1$ of the first contact probe 21. The interposer 30 comprises a substrate 31 which has a through hole 311 into which the first contact probe 21 is to be inserted, and a wiring pattern 32 which is disposed on the substrate 31, and the wiring pattern 32 has a pad 321 with which the second contact probe 22 is to contact.

15 Claims, 11 Drawing Sheets

(51) Int. Cl.
  *G01R 1/073*    (2006.01)
  *G01R 31/28*    (2006.01)
  *H01L 23/00*    (2006.01)
  *H01L 23/498*   (2006.01)

(58) Field of Classification Search
  CPC .... G01R 1/07371; G01R 31/00; G01R 31/02; G01R 31/28; G01R 31/2889; G01R 31/2851; H01L 23/00; H01L 23/498
  See application file for complete search history.

(56)           References Cited

FOREIGN PATENT DOCUMENTS

JP       2013-234912  A      11/2013
TW            I574473  B      3/2017

OTHER PUBLICATIONS

Office Action issued in the counterpart Taiwanese Patent Application No. 109100296, dated May 27, 2021 (6 pages).
Office Action issued in corresponding Korean Patent Application No. 10-2020-0001162 dated Oct. 29, 2021 (8 pages).

* cited by examiner

INTERPOSER, SOCKET, SOCKET ASSEMBLY, AND WIRING BOARD ASSEMBLY

TECHNICAL FIELD

The present invention relates to an interposer and a socket used for testing an electronic component under test (DUT: Device Under Test) such as a semiconductor integrated circuit device, and to a socket assembly and a wiring board assembly including the interposer and the socket.

The present application claims priority from Japanese Patent Application No. 2019-053516 filed on Mar. 20, 2019. The contents described and/or illustrated in the documents relevant to the Japanese Patent Application No. 2019-053516 will be incorporated herein by reference as a part of the description and/or drawings of the present application.

BACKGROUND ART

A technique for mounting a socket having a connection terminal electrically connected to an external terminal of a component under test on a load board of a test head is known (see, for example, Patent Document 1 (paragraph [0038] and FIG. 1)).

CITATION LIST

Patent Document

PATENT DOCUMENT 1: JP 2013-234912 A

SUMMARY OF THE INVENTION

Problem to be Solved by the Invention

However, when a fine circuit such as a circuit for a high-frequency signal is interposed between the socket and the test head, the above-described technique requires that the circuit is formed on the load board, and the above-described technique leads to a problem that the cost of the load board is increased.

An object of the present invention is to provide an interposer and a socket, and a socket assembly and a wiring board assembly comprising the interposer and the socket, which can achieve a low cost.

Means for Solving Problem

An interposer according to the present invention is an interposer which is to be interposed between a socket and a wiring board, the interposer comprising: a substrate which has a first through hole into which a first contactor of the socket is to be inserted; and a first conductive path which is disposed on the substrate, wherein the first conductive path has a first contact portion with which a second contactor of the socket is to contact.

In the above invention, the interposer may further comprise a circuit which is connected to the first conductive path.

In the above invention, the interposer may further comprise a connector which is mounted on the substrate and to which the first conductive path is connected.

A socket according to the present invention is a socket to which a DUT is to be electrically connected, the socket comprising: a first contactor which has a first end which is to contact with a first terminal of the DUT; a second contactor which has a second end which is to contact with a second terminal of the DUT; and a holding member which holds the first contactor and the second contactor so that the first end and the second end are located on substantially the same virtual plane, wherein the second contactor has a length shorter than the length of the first contact.

In the above invention, the socket may further comprise air layer forming means which is to form an air layer between the holding member and an interposer.

A socket assembly according to the present invention is a socket assembly comprising: the above-described interposer; and a socket to which a DUT is to be electrically connected and to which the interposer is attached, wherein the socket comprises: a first contactor which has a first end and which is inserted into the first through hole of the interposer, the first end being to contact with the first terminal of the DUT; a second contactor which has a second end and which contacts with the first contact portion of the interposer, the second end being to contact with the second terminal of the DUT; and a holding member which holds the first contactor and the second contactor so that the first end and the second end are located on substantially the same virtual plane, and the second contactor has a length shorter than the length of the first contactor.

In the above invention, an air layer may be formed between the holding member and the interposer.

In the above invention, the substrate of the interposer may have an exposed region which is exposed from the socket, and the connector may be disposed on the exposed region so as to be located on the same side of the substrate as the socket.

A wiring board assembly according to the present invention is a wiring board assembly comprises: the above-described interposer; and a wiring board to which the interposer is attached, wherein the wiring board comprises a second conductive path which has a second contact portion which is disposed so as to face the first through hole of the interposer.

In the above invention, the wiring board assembly further comprises a socket which is attached to the wiring board via the interposer, the socket comprises: a first contactor which has a first end, which is inserted into the first through hole of the interposer and which contacts with the second contact portion of the wiring board, the first end being to contact with the first terminal of the DUT; a second contactor which has a second end and which contacts the first contact portion of the interposer, the second end being to contact with the second terminal of the DUT; and a holding member which holds the first contactor and the second contactor so that the first end and the second end are located on substantially the same virtual plane, and the second contactor may have a length shorter than a length of the first contactor.

In the above invention, an air layer may be formed between the holding member and the interposer.

In the above invention, the substrate of the interposer may have an exposed region which is exposed from the socket, and the connector may be mounted on an opposite main surface opposite to a main surface which faces the wiring board in the exposed region.

In the above invention, the wiring board may have a second through hole into which the connector is inserted.

In the above invention, the connector is mounted on an opposite main surface on a side opposite to the main surface which faces the wiring board in the substrate of the interposer, and the substrate may have a third through hole into which the connector is inserted.

Effect of the Invention

In the interposer according to the present invention, the substrate has a first through hole into which the first contactor of the socket is to be inserted, and the first conductive path has a first contact portion with which the second contactor of the socket is to contact. Correspondingly, in the socket according to the present invention, the ends of the first and second contactors are located on substantially the same virtual plane, and the length of the second contactor is shorter than the length of the first contactor. Therefore, since the first contactor can be connected to the wiring board and the second contactor can be connected to the interposer having the circuit, cost reduction can be achieved.

BRIEF DESCRIPTION OF DRAWING(S)

MODE(S) FOR CARRYING OUT THE INVENTION

Hereinafter, an embodiment of the present invention will be described with reference to the drawings.

Figure 1:
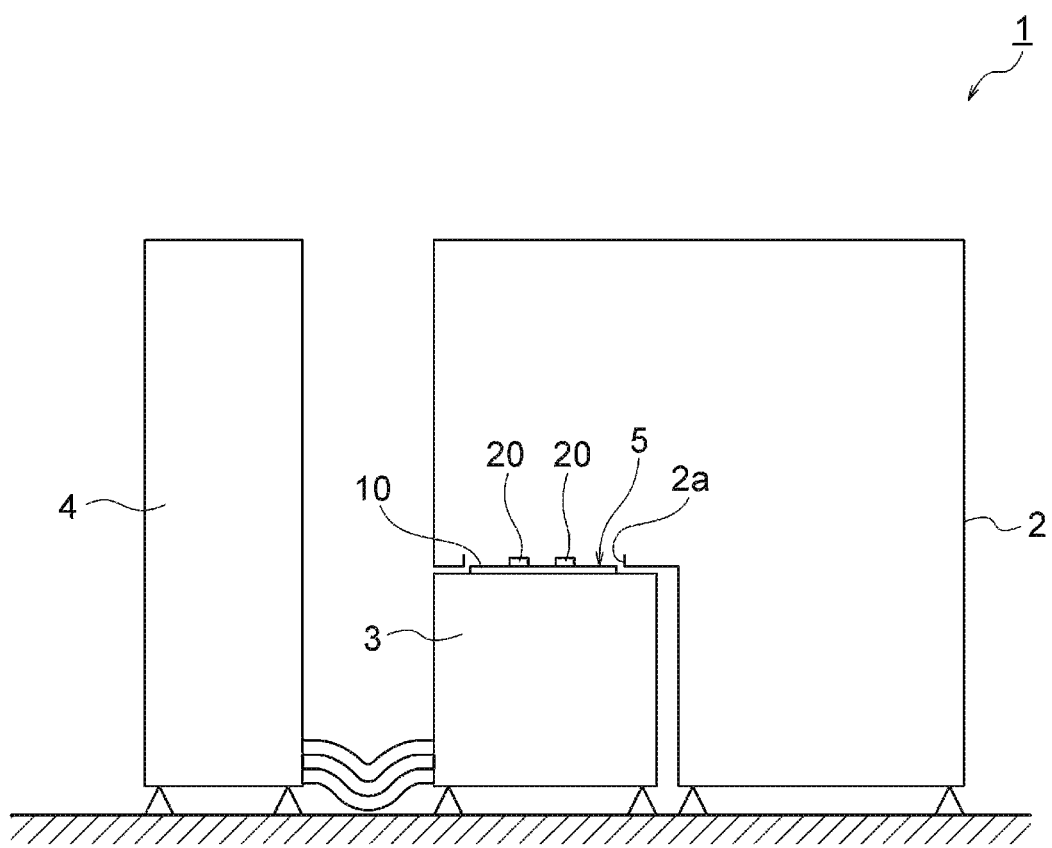
FIG. 1 is a schematic cross-sectional view showing an entire configuration of an electronic component testing apparatus in the first embodiment of the present invention.

FIG. 1 is a schematic cross-sectional view showing an entire configuration of an electronic component testing apparatus in the first embodiment of the present invention.

Figure 3:
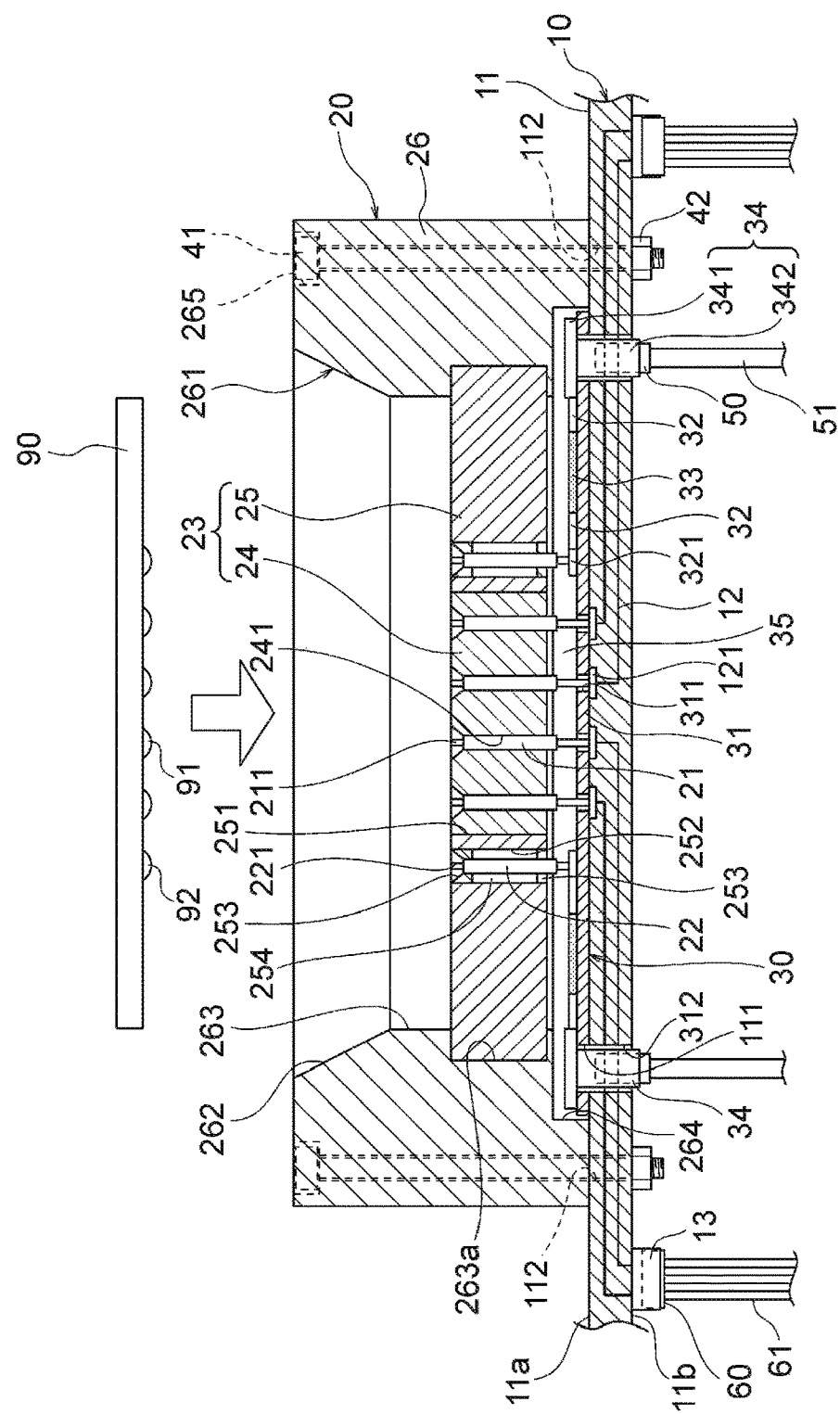
FIG. 3 is a cross-sectional view showing a wiring board assembly in the first embodiment of the present invention and is a cross-sectional view along line III-III of FIG. 2.

The electronic component testing apparatus 1 of the present embodiment is an apparatus for testing electric characteristics of a DUT 90 (refer to FIG. 3). Specific examples of the DUT 90 to be tested include a SoC (System on a chip) and a logic-based device. The DUT 90 to be tested by the electronic component testing device 1 is not particularly limited to the above as long as it is an electronic component, and may be, for example, a memory-based device.

As shown in FIG. 1, the electronic component testing apparatus 1 includes a handler 2 which handles a DUT 90, a test head 3 which is electrically connected to a DUT 90 at the time of testing, and a tester main body 4 which sends test signals to a DUT 90 via the test head 3 and executes a test of the DUT 90. The electronic component testing apparatus 1 tests a DUT 90 while applying a high-temperature or low-temperature thermal stress to the DUTs, and classifies the DUT 90 according to the test result.

A wiring board assembly 5 for relaying electric connections between the DUT 90 and the test head 3 is mounted on an upper portion of the test head 3. The wiring board assembly 5 includes a test wiring board 10, a socket 20 mounted on the test wiring board 10, and an interposer 30 (refer to FIG. 3) interposed between the test wiring board 10 and the socket 20. The test wiring board 10 in the present embodiment corresponds to an example of the "wiring board" in the present invention.

The socket 20 enters the inside of the handler 2 through an opening 2a formed in the handler 2, and the DUT 90 conveyed in the handler 2 is pressed against the socket 20, and the DUT 90 is electrically connected to the socket 20.

Although not shown in particular, the handler 2 has an arm for holding and moving the DUT 90, and a temperature adjusting mechanism for adjusting the temperature of the DUT 90 is provided at a distal end of the arm of the handler 2. The arm presses the DUT 90 against the sockets 20 with thermal stress applied to the DUT 90.

Hereinafter, the configuration of the wiring board assembly 5 in the first embodiment of the present invention will be described in detail with reference to FIG. 2 to FIG. 7.

Figure 2:
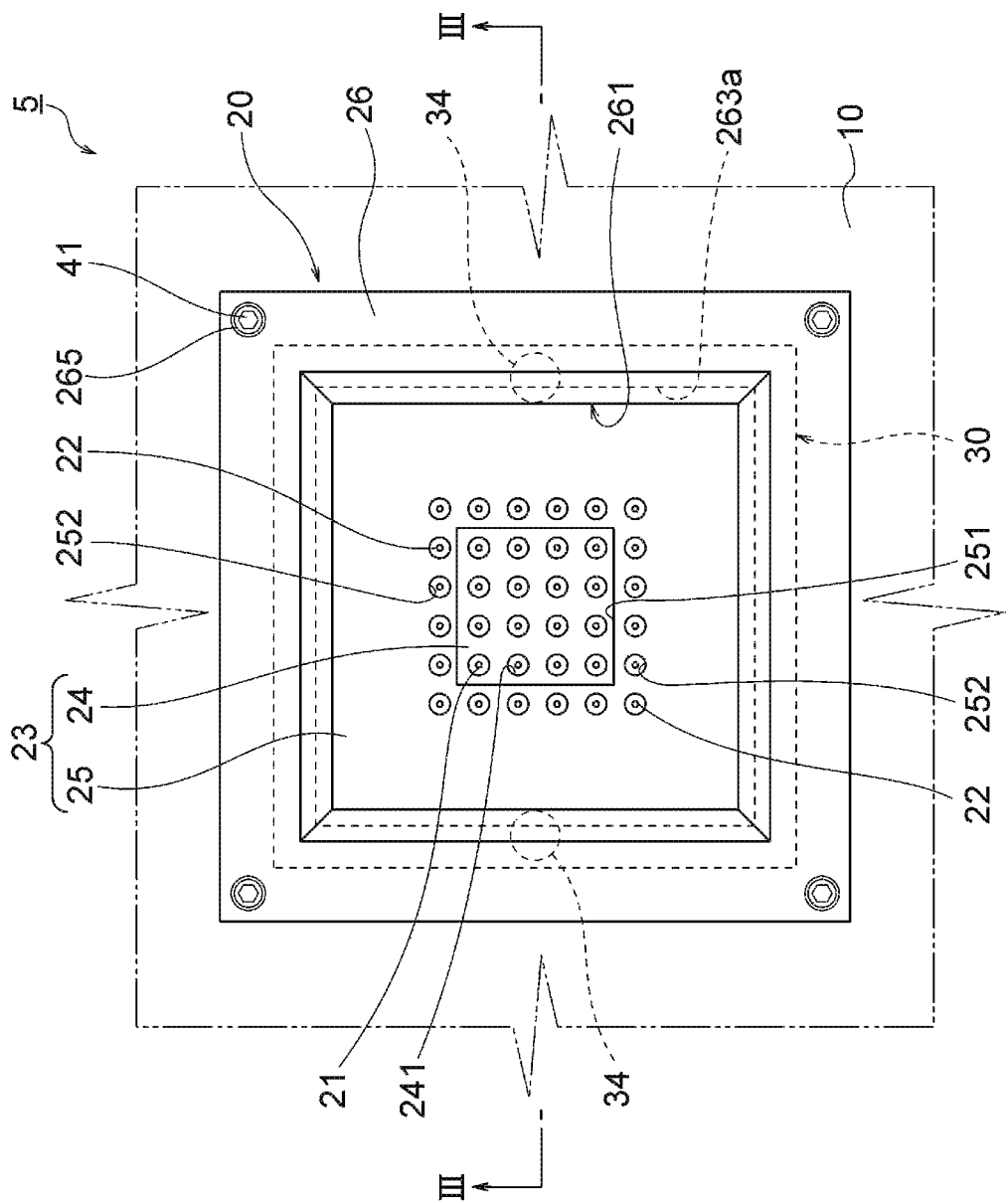
FIG. 2 is a plan view showing a wiring board assembly in the first embodiment of the present invention.
Figure 4:
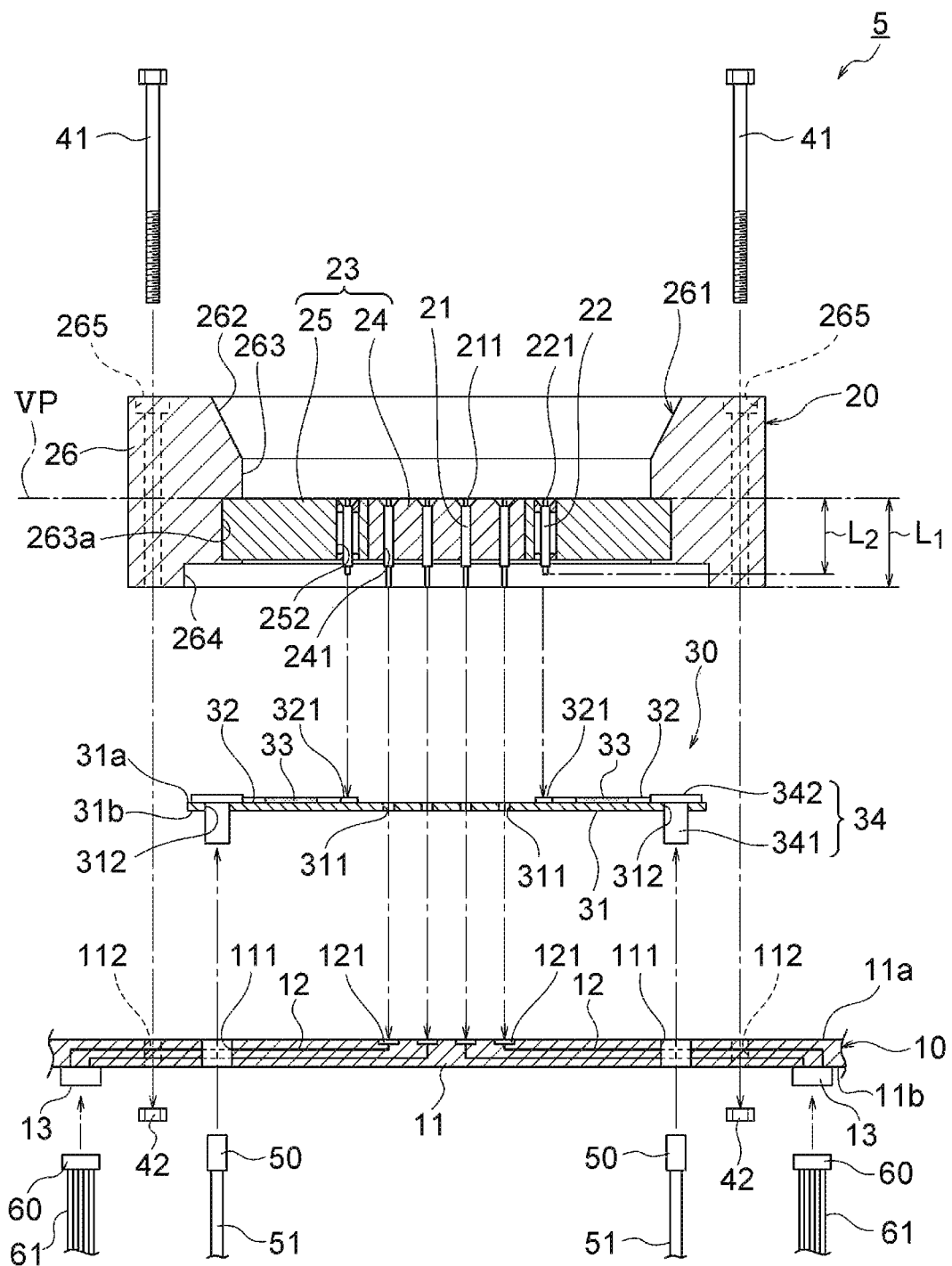
FIG. 4 is an exploded cross-sectional view of a wiring board assembly in the first embodiment of the present invention.
Figure 5:
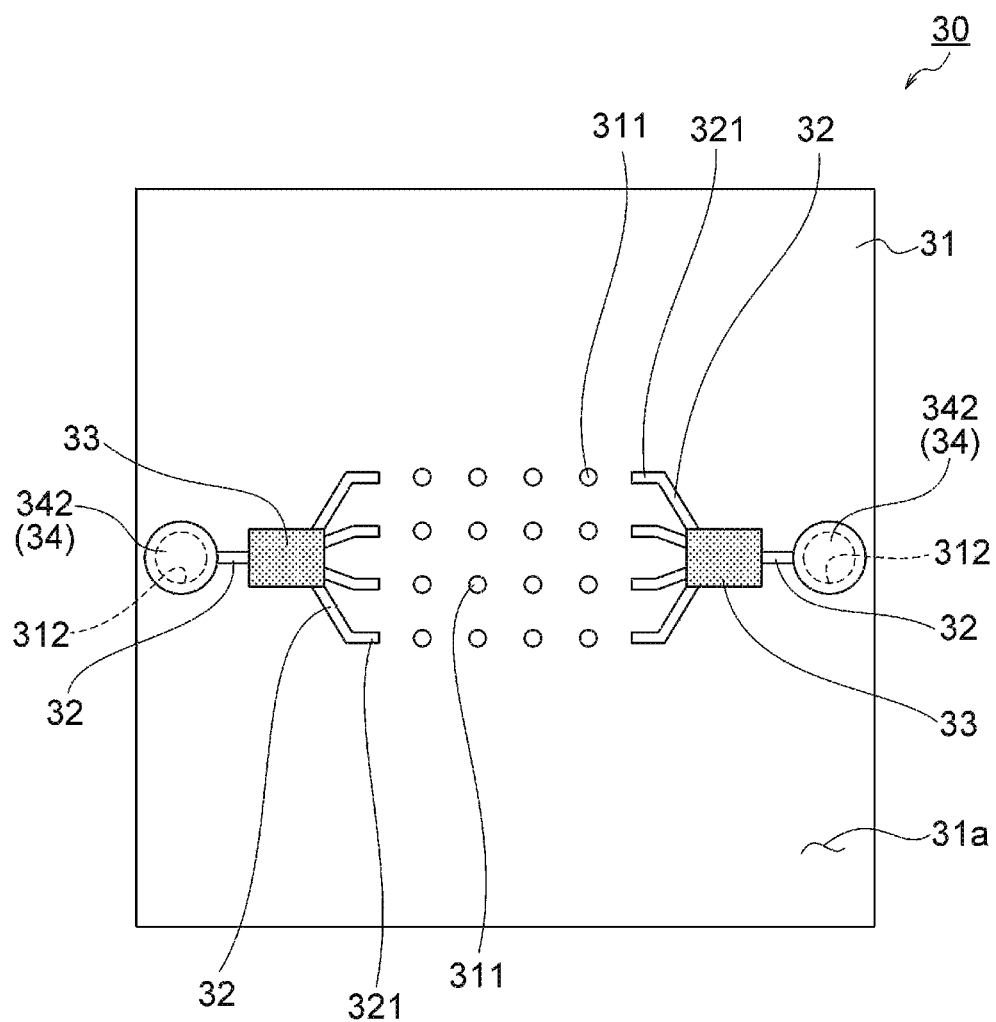
FIG. 5 is a plan view showing an interposer in the first embodiment of the present invention.
Figure 6:
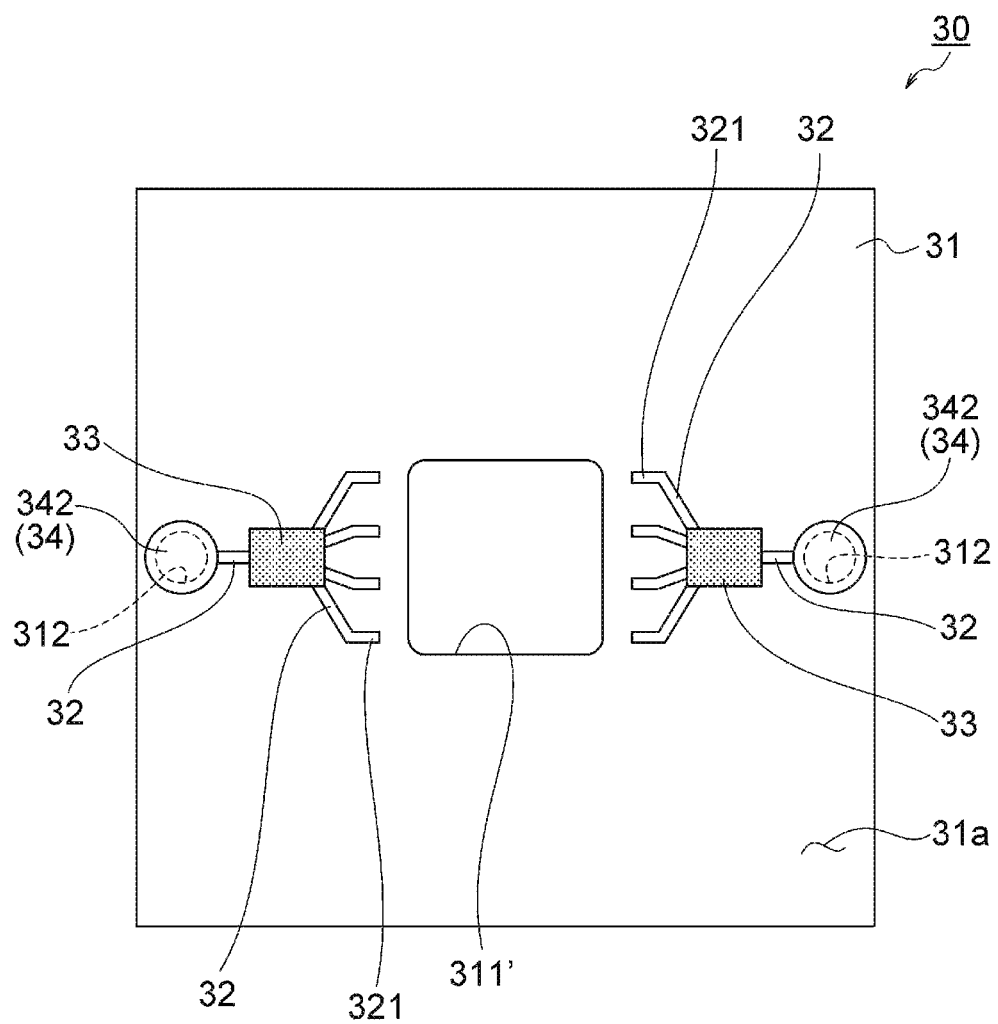
FIG. 6 is a plan view showing a modification of the interposer in the first embodiment of the present invention.
Figure 7:
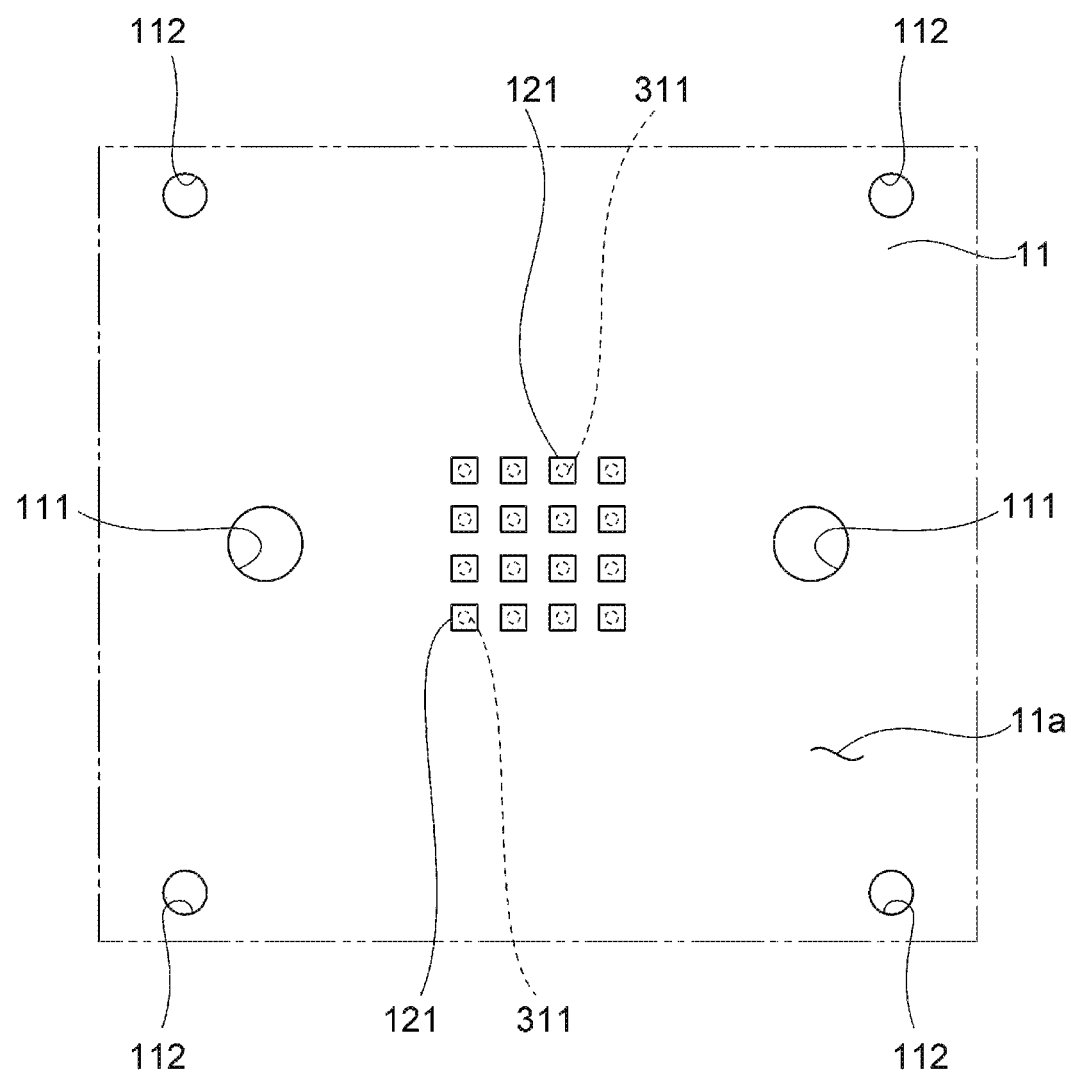
FIG. 7 is a plan view showing a test wiring board in the first embodiment of the present invention.

FIG. 2 and FIG. 3 are a plan view and a cross-sectional view showing a wiring board assembly in the present embodiment, FIG. 4 is an exploded cross-sectional view of a wiring board assembly in the present embodiment, FIG. 5 is a plan view showing an interposer in the present embodiment, FIG. 6 is a plan view showing a modification of the interposer in the present embodiment, and FIG. 7 is a plan view showing a test wiring board in the present embodiment.

As shown in FIG. 2 to FIG. 4, the socket 20 includes two types of contact probes 21 and 22, an inner housing 23, and an outer housing 26.

The first contact probe 21 in the present embodiment corresponds to an example of the "first contactor" in the present invention, the second contact probe 22 in the present embodiment corresponds to an example of the "second contactor" in the present invention, the inner housing 23 in the present embodiment corresponds to an example of the "holding member" in the present invention, and the outer housing 26 in the present embodiment corresponds to an example of the "air layer forming means" in the present invention.

Although not particularly limited, both of the first and second contact probes 21 and 22 are so-called POGO pin. As shown in FIG. 3 and FIG. 4, the first contact probes 21 are held by the inner housings 23 so that the plungers 211 abut the first terminals 91 of the DUT 90. The first terminal 91 of DUT 90 is a terminal for a low-frequency signal, a power source, or a ground, and the first contact probe 21 is also a contactor for a low-frequency signal, a power source, or a ground.

On the other hand, the second contact probes 22 are held by the inner housings 23 so that the plungers 221 abut the second terminals 92 of the DUT 90. The second terminal 92 of DUT 90 is a terminal for a high-frequency signal, and the second contact probe 22 is also a contactor for a high-frequency signal.

As shown in FIG. 2 to FIG. 4, the inner housing 23 is a member having a first body portion 24 and a second body portion 25. Although not particularly limited, in the present embodiment, the first main body portion 24 is made of a material having electrical insulating properties, such as a resin material. On the other hand, the second main body 25 is made of a conductive material such as a metal material, and the second main body 25 is connected to the ground.

The first body portion 24 is a rectangular plate-shaped member. A plurality of holding holes 241 which penetrate the first main body 24 are formed in the first main body 24. In the present embodiment, 16 holding holes 241 are arranged at equal intervals in an array of 4 rows and 4 columns. The first contact probes 21 are inserted into the plurality of holding holes 241, respectively. The inner surface of the holding hole 241 is in contact with the side surface of the first contact probe 21, and each of the first contact probes 21 is directly held by the first body portion 24.

The second body portion 25 is a frame-shaped member surrounding the first body portion 24. The first body portion 24 is inserted into the opening 251 of the second body portion 25, and the first body portion 24 is held by the second body portion 25. A plurality of holding holes 252 which penetrate the second main body 25 are also formed in the second main body 25. In the present embodiment, 20 holding holes 252 are annularly arranged along the opening 251. The pitch of the holding holes 252 of the second body portion 25 is substantially the same as the pitch of the holding holes 241 of the first body portion 24, and as a result, 36 holding holes 241 and 252 are arranged at equal intervals in an array of 6 rows and 6 columns.

The second contact probes 22 are inserted into the plurality of holding holes 252, respectively. The inner diameter of the holding hole 252 is larger than the outer diameter of the second contact probe 22. Therefore, the second contact probe 22 is held by the second main body 25 via the resin members 253 provided on the upper portion and the lower part portion of the contact probe 22. As a result, an air layer 254 is formed between the inner surface of the holding hole 252 and the side surface of the second contact probe 22 except for the resin members 253, and the coaxial structure of the second contact probe 22 is secured by the air layer 254 and the metallic second body portion 25.

The number and arrangement of the first contact probes 21 included in the socket 20 are not particularly limited to the above. The number and arrangement of the second contact probes 22 included in the socket 20 are not particularly limited to the above. The number and arrangement of the contact probes 21 and 22 included in the sockets 20 are set in accordance with the number and arrangement of the terminals 91 and 92 of the DUT 90.

In the present embodiment, as shown in FIG. 4, the tip of the plunger 211 of the first contact probe 21 and the tip of the plunger 221 of the second contact probe 22 are located on substantially the same virtual plane VP. In the present embodiment, the total length $L_2$ of the second contact probe 22 is shorter than the total length $L_1$ of the first contact probe 21 ($L_2<L_1$).

Therefore, the lower end portion of the second contact probe 22 is positioned above the lower end portion of the first contact probe 21, and a step is formed between the lower end portion of the second contact probe 22 and the lower end portion of the first contact probe 21. Since the first and second contact probes 21 and 22 have such a stepped structure, in the present embodiment, the second contact probe 22 is in contact with the interposer 30, whereas the first contact probe 21 penetrates the interposer 30 and contacts the test wiring board 10.

The tip of the plunger 211 of the first contact probe 21 in the present embodiment corresponds to an example of the "first end" in the present invention, and the tip of the plunger 221 of the second contact probe 22 in the present embodiment corresponds to an example of the "second end" in the present invention.

The outer housing 26 has a rectangular frame shape. The opening 261 of the outer housing 26 includes a first portion 262, a second portion 263, and a third portion 264.

The first portion 262 is open toward the side opposite to the test wiring board 10. The first portion 262 expands in a tapered shape toward the outside. The second portion 263 is connected to the first portion 262 and has an inner shape larger than the outer shape of the DUT 90. The DUT 90 enters the outer housing 26 through the first and second portions 262, 263.

A groove 263a is formed on the entire circumference of the inner surface of the second portion 263. The outer edge of the inner housing 23 is inserted into the groove 263a so that the inner housing 23 is held by the outer housing 26. When the DUT 90 enters the outer housing 26 through the first and second portions 262 and 263, the terminals 91 and 92 of the DUT 90 come into contact with the ends of the contact probes 21 and 22 held by the inner housing 23.

On the other hand, the third portion 264 is open toward the test wiring board 10. The third portion 264 has an inner shape larger than the inner shape of the second portion 263, and a step is formed between the second portion 263 and the third portion 264. The inner shape of the third portion 264 is larger than the outer shape of the interposer 30, and the interposer 30 is accommodated in the third portion 264. At this time, the outer housing 26 holds the inner housing 23 so that a predetermined space, i.e., the air layer 35, is formed between the interposer 30 and the inner housing 23.

As shown in FIG. 3 to FIG. 5, the interposer 30 includes a substrate 31, a wiring pattern 32, a circuit 33, and a coaxial connector 34. The substrate 31 in the present embodiment corresponds to an example of the "substrate" in the present invention, the wiring pattern 32 in the present embodiment corresponds to an example of the "first conductive path" in the present invention, and the coaxial connector 34 in the present embodiment corresponds to an example of the "connector" in the present invention.

The substrate 31 is made of an electrically insulating material. Although not particularly limited, examples of the material constituting the substrate 31 include a resin material, silicon, glass, ceramics, and the like. Specific examples of the resin material of the substrate 31 include polyimide (PI), polyetheretherketone (PEEK), and the like.

In the present embodiment, the substrate 31 has an outer shape smaller than the outer shape of the socket 20. 16 through holes 311 are formed in the substrate 31 in an array of 4 rows and 4 columns. The through-holes 311 are arranged coaxially with the holding holes 241 of the first main body portion 24 of the inner housing 23, and the first contact probes 21 are respectively inserted into the through-holes 311.

The number and arrangement of the through holes 311 included in the substrate 31 are not particularly limited to the above, and are set in accordance with the number and arrangement of the first contact probes 21. The through hole 311 in the present embodiment corresponds to an example of the "first through hole" in the present invention.

A pair of through holes 312 are formed in the substrate 31. The through hole 312 penetrates the substrate 31, and the fitting portion 341 of the coaxial connector 34 is inserted into each of the through holes 312. The through hole 312 in the present embodiment corresponds to an example of the "third through hole" in the present invention.

As shown in FIG. 6, instead of the 16 through holes 311, one through hole 311' may be formed in the substrate 31. The through hole 311' has a shape facing all the holding holes 241 of the first main body portion 24 of the inner housing 23.

Returning to FIG. 3 to FIG. 5, a wiring pattern 32 is provided on the upper surface 31a of the substrate 31. The wiring pattern 32 extends linearly on the upper surface 31a of the substrate 31, and the wiring pattern 32 has a pad 321 at one end thereof. The pad 321 is disposed so as to face the holding hole 252 of the second body portion 25 of the inner housing 23, and the second contact probe 22 is in contact with the pad 321.

The number and arrangement of the pads 321 are not particularly limited to the above, and are set in accordance with the number and arrangement of the second contact probes 22. The pad 321 in the present embodiment corresponds to an example of the "first contact portion" in the present invention.

In the present embodiment, the circuit 33 is provided in the wiring pattern 32. The circuit 33 is a fine circuit for a high-frequency signal and includes at least one of a portion (wiring pattern, resistor, or the like) directly formed on the upper surface 31a of the substrate 31 and a portion (electronic component or the like) mounted on the upper surface 31a. Although not particularly limited, for example, a millimeter wave band signal distribution circuit can be exemplified as a specific example of the circuit section 33.

A coaxial connector 34 is connected to the other end of the wiring pattern 32. The coaxial connector 34 is a SMT (Surface Mount Type) type coaxial connector and includes a cylindrical fitting portion 341 into which the counterpart coaxial connector 50 fits, and a base portion 342 which supports the fitting portion 341.

The coaxial connector 34 is mounted on the upper surface 31a of the substrate 31 in a state where the base portion 342 is located on the upper surface 31a side of the substrate 31 and the fitting portion 341 is inserted into the through hole 312 of the substrate 31. More specifically, the base portion 342 is connected to the other end of the wiring pattern 32 on the upper surface 31a of the substrate 31, and the fitting portion 341 protrudes downward from the base portion 342 and penetrates the substrate 31 through the through hole 312. The counterpart coaxial connector 50 is connected to the fitting portion 341 of the coaxial connector 34 from below. A coaxial cable 51 is led out from the counterpart coaxial connector 50.

Figure 8:
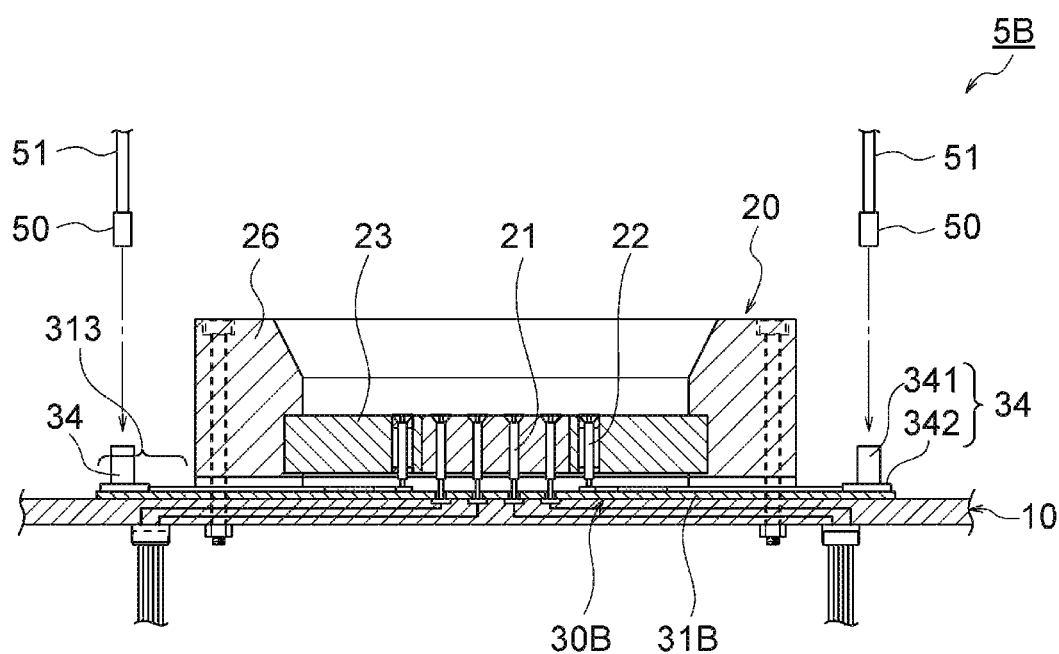
FIG. 8 is a cross-sectional view showing a wiring board assembly in the second embodiment of the present invention.

As shown in FIG. 8, the coaxial connector 34 may be mounted on the upper surface 31a of the substrate 31 with the fitting portion 341 protruding upward. FIG. 8 is a cross-sectional view showing a wiring board assembly 5B in the second embodiment of the present invention. In this case, the substrate 31B has an exposed region 313 exposed from the socket 20 by making the width of the substrate 31B larger than the width of the socket 20, and the coaxial connector 34 is mounted on the upper surface 31a of the exposed region 313.

Although not particularly illustrated, the coaxial connector 34 may be mounted on the lower surface 31b of the substrate 31. In this case, the first conductive path includes, in addition to the wiring pattern 32, a through conductive path penetrating the substrate 31 such as a via.

The test wiring board 10 is a so-called performance board (a load board). As shown in FIG. 3, FIG. 4, and FIG. 7, the test wiring board 10 includes a substrate 11 made of an electrically insulating material, a conductive path 12 provided in the substrate 11, and a connector 13 mounted on a lower surface 11b of the substrate 11. The test wiring board 10 may be a so-called socket board. The conductive path 12 in the present embodiment corresponds to an example of the "second conductive path" in the present invention.

A pair of through holes 111 are formed in the substrate 11. Each of the through holes 111 is disposed so as to correspond to the coaxial connector 34 of the interposer 30, and penetrates the substrate 11. The through hole 111 in the present embodiment corresponds to an example of the "second through hole" in the present invention.

The conductive path 12 is composed of a wiring pattern provided on the upper surface 11a and/or the lower surface 11b of the substrate 11, a via penetrating the substrate 11, and the like, and the conductive path 12 has a pad 121 at one end thereof. The pad 121 is disposed so as to face the through hole 311 of the interposer 30. The first contact probes 21 are respectively in contact with the pads 121. For convenience of illustration, in FIG. 3 and the like, the pad 121 is buried in the substrate 11, but the pad 121 is actually provided on the upper surface 11a of the substrate 11.

The number and arrangement of the pads 121 are not particularly limited to the above, and are set in accordance with the number and arrangement of the first contact probes 21. The pad 121 in the present embodiment corresponds to an example of the "second contact portion" in the present invention.

The other end of the wiring pattern 12 is connected to a connector 13. A cable 61 is led out from a counterpart connector 60 which fits into the connector 13. Since the connectors 13 and 60 are connectors for low-frequency signals, power supply, or ground, the connectors 13 and 60 do not have a coaxial structure unlike the coaxial connectors 34 and 50 described above.

The test wiring board 10, the socket 20, and the interposer 30 described above are assembled as follows.

That is, as shown in FIG. 3 and FIG. 4, the socket 20 is attached to the test wiring board 10 in a state in which the interposer 30 is sandwiched between the socket 20 and the test wiring board 10. At this time, the first contact probe 21 is brought into contact with the pad 121 of the test wiring board 10 via the through hole 311 of the interposer 30, and the second contact probe 22 is brought into contact with the pad 321 of the interposer 30. The coaxial connector 34 is inserted into the through hole 111 of the test wiring board 10.

Next, the bolt 41 is inserted into the fixing holes 265 and 112 of the outer housing 26 and the test wiring board 10 and is screwed with the nut 42. As a result, the socket 20 is fixed to the test wiring board 10, and the interposer 30 is sandwiched between the socket 20 and the test wiring board 10, thereby the wiring board assembly 5 is completed. The method of fixing the socket 20 to the test wiring board 10 is not particularly limited, and may be a method other than bolt fastening.

In the present embodiment, in a condition in which the socket 20 is fixed to the test wiring board 10 as described above, the interposer 30 is accommodated in the third portion 263 of the opening 261 of the outer housing 26 of the socket 20, and the air layer 35 is formed between the interposer 30 and the inner housing 23. The microstrip line structure of the wiring pattern 32 of the interposer 30 is secured by the air layer 35 and the metallic second main body portion 25.

Although not particularly illustrated, for example, a strip line structure of the wiring pattern 32 of the interposer 30 may be secured by forming a ground wiring pattern on the lower surface 31b of the substrate 31 of the interposer 30.

Figure 9:
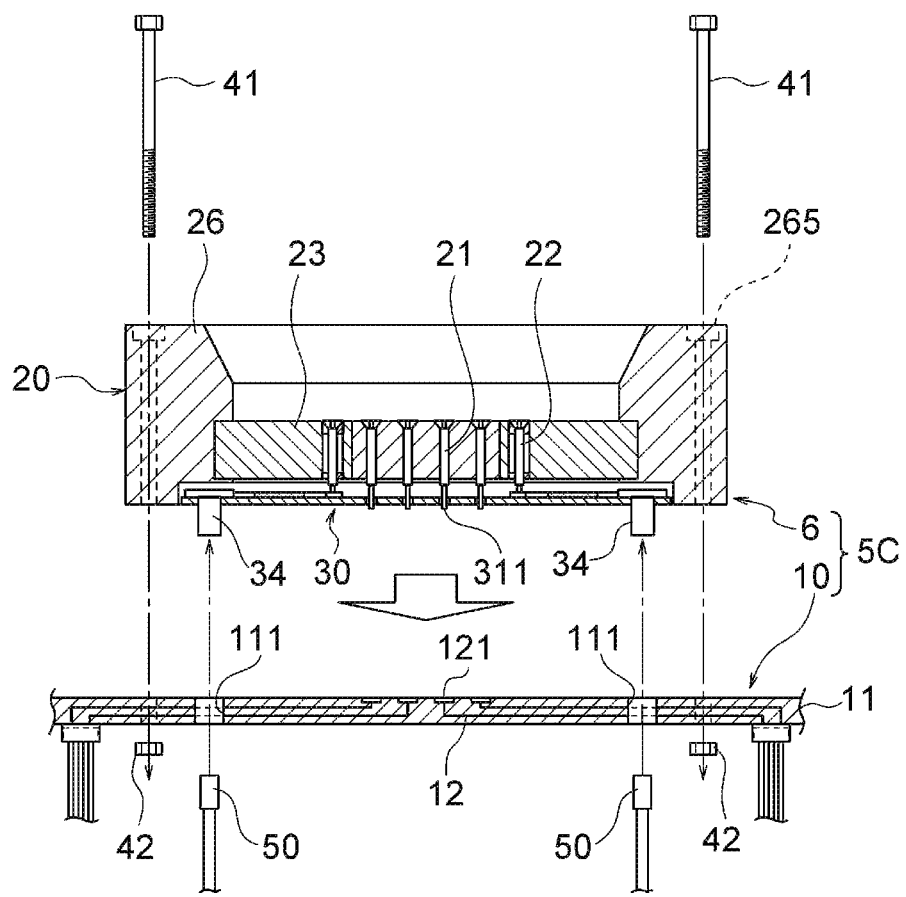
FIG. 9 is a cross-sectional view showing a wiring board assembly in the third embodiment of the present invention.
Figure 10:
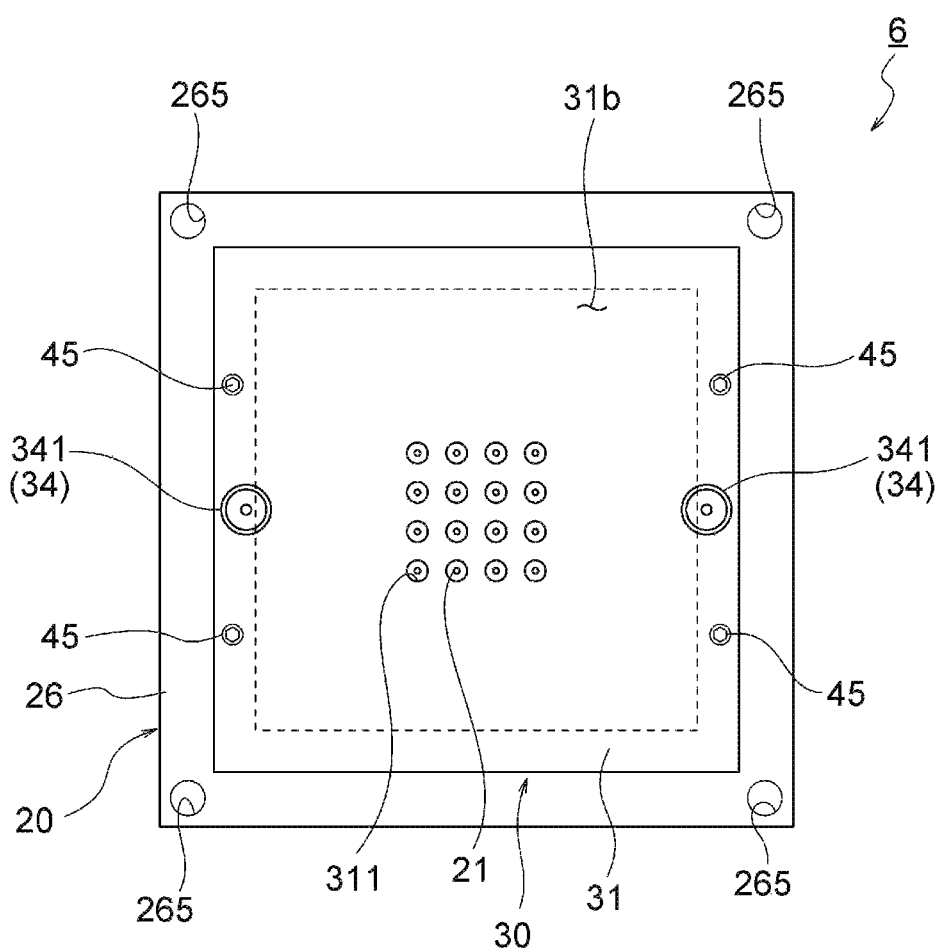
FIG. 10 is a bottom view showing a socket assembly in the third embodiment of the present invention.

As shown in FIG. 9, the socket assembly 6 composed of the socket 20 and the interposer 30 may be assembled in advance, and the socket assembly 6 may be attached to the test wiring board 10. In this case, as shown in FIG. 10, the interposer 30 is fixed to the socket 20 by bolts 45, thereby the socket assembly 6 is formed. The method of fixing the interposer 30 to the socket 20 is not particularly limited, and may be a method other than bolt fastening. FIG. 9 is a cross-sectional view showing the wiring board assembly 5C in the third embodiment of the present invention, and FIG. 10 is a bottom view showing the socket assembly 6 in the third embodiment of the present invention.

Figure 11:
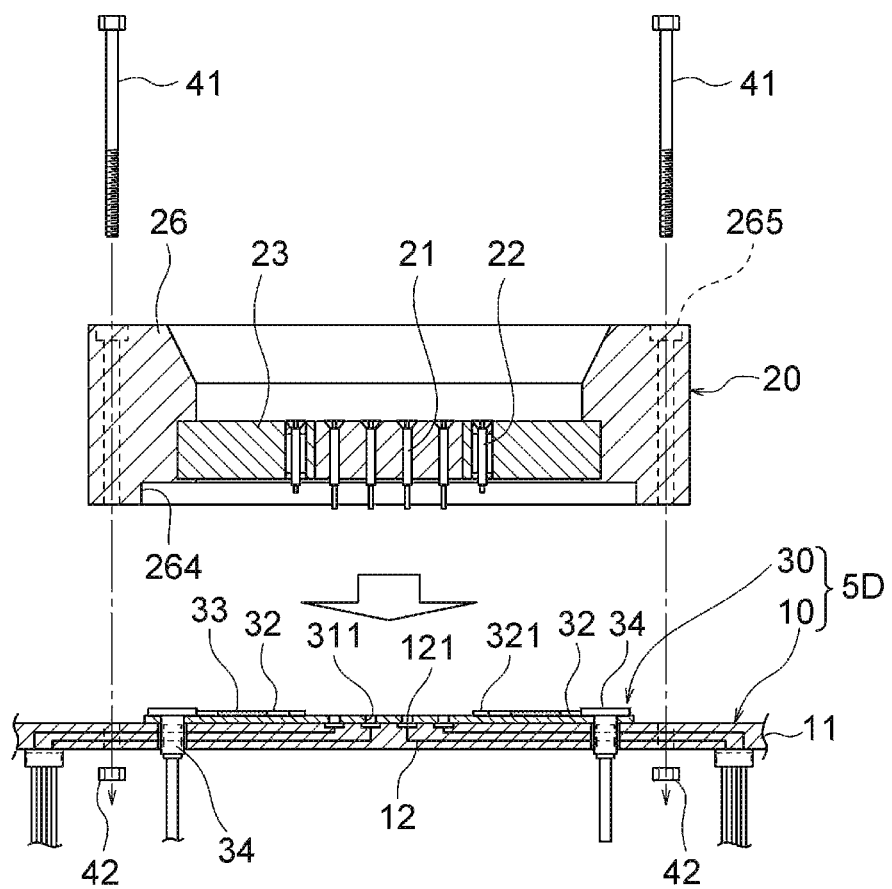
FIG. 11 is a cross-sectional view showing a wiring board assembly in the fourth embodiment of the present invention.

Alternatively, as shown in FIG. 11, the wiring board assembly 5D composed of the testing wiring board 10 and the interposer 30 may be assembled in advance, and the sockets 20 may be attached to the wiring board assembly 5D. In this case, the interposer 30 may be fixed to the test wiring board 10, or the interposer 30 may be simply laid on the test wiring board 10 without being fixed to the test wiring board 10. FIG. 11 is a cross-sectional view showing the wiring board assembly 5D in a fourth embodiment of the present invention.

Returning to FIG. 3 and FIG. 4, when the wiring board assembly 5 is completed, the wiring board assembly 5 is mounted on the test head 3. Specifically, the counterpart coaxial connector 50 is connected to the coaxial connector 34 of the interposer 30, and the counterpart connector 60 is connected to the connector 13 of the test wiring board 10. As a result, the wiring board assembly 5 is electrically connected to the test head 3.

In a DUT 90 test using the wiring board assembly 5 of the present embodiment, the first contact probe 21 contacts the first terminal 91 of the DUT 90, and the second contact probe 22 contacts the second terminal 92 of the DUT 90.

Therefore, concerning the high-frequency signal, the second terminal 92 of the DUT 90 and the testing head 3 are electrically connected to each other via the second contact probes 22, the interposers 30 (wiring patterns 32, circuits 33, and coaxial connectors 34), the coaxial connectors 50, and the coaxial cables 51. On the other hand, concerning the low-frequency signals, the power supply, and the ground, the first terminal 91 of the DUT 90 and the test head 3 are electrically connected to each other via the first contact probes 21, the test wiring board 10 (conductive paths 12 and connector 13), the connector 60, and the connector 61.

That is, in this embodiment, the path for the high-frequency signal is independent from the path for the low-frequency signal, the power source and the ground, and the DUT 90 and the test head 3 are electrically connected through the interposer 30. For this reason, it is possible to form a fine circuit 33 for high-frequency signals such as a millimeter wave band signal distribution circuit in the interposer 30 smaller than the test wiring board 10, instead of the large test wiring board 10, and it is possible to achieve cost reduction.

In particular, in the interposer 30 of the present embodiment, the substrate 31 has a through hole 311 into which the first contact probe 21 is to be inserted, and the wiring pattern 32 has a pad 321 with which the second contact probe 22 is to contact. Therefore, while the first contact probe 21 for the low frequency signal, the power supply and the ground can be connected to the test wiring board 10, the second contact probe 22 for the high frequency signal can be connected to the interposer 30 having the circuit 33 for the high frequency signal.

In the socket 20 of the present embodiment, the tip of the first contact probe 21 and the tip of the second contact probe 22 are located on substantially the same virtual plane VP, and the total length $L_2$ of the second contact probe 22 is shorter than the total length $L_1$ of the first contact probe 21 ($L_2 < L_1$). Therefore, the first contact probe 21 can be connected to the test wiring board 10, while the second contact probe 22 can be connected to the interposer 30.

Further, in the present embodiment, since the interposer 30 is disposed closer to the DUT 90 than the test wiring board 10 and the circuit 33 is formed in the interposer 30, the accuracy of the DUT 90 test can be improved.

Embodiments heretofore explained are described to facilitate understanding of the present invention and are not described to limit the present invention. It is therefore intended that the elements disclosed in the above embodiments include all design changes and equivalents to fall within the technical scope of the present invention.

EXPLANATIONS OF LETTERS OR NUMERALS 5, 5B-5D . . . wiring board assembly
6 . . . socket assembly
10 . . . test wiring board
11 . . . substrate
111 . . . through hole
12 . . . conductive path
121 . . . pad
20 . . . socket
21, 22 . . . contact probe
23 . . . inner housing
26 . . . outer housing
30 . . . interposer
31 . . . substrate
311 . . . through hole
312 . . . through hole
313 . . . exposed area
32 . . . wiring pattern
321 . . . pad
33 . . . circuit
34 . . . coaxial connector
35 . . . air layer
90 . . . DUT

The invention claimed is:

1. An interposer to be interposed between a socket and a wiring board, the interposer comprising:
   a substrate having a first through hole into which a first contactor of the socket is inserted; and
   a first conductive path disposed on the substrate, wherein
   the first conductive path comprises a first contact portion that contacts a second contactor of the socket,
   the interposer is a separate member from the wiring board that detachably attaches to the interposer,
   the first through hole penetrates the substrate along a thickness direction of the substrate, and
   the substrate directly contacts the wiring board when the interposer is interposed between the socket and the wiring board.

2. The interposer according to claim 1, wherein the interposer further comprises a circuit that is connected to the first conductive path.

3. The interposer according to claim 1, wherein the interposer further comprises a connector that is mounted on the substrate and that is connected to the first conductive path.

4. A socket assembly comprising:
   the interposer according to claim 1; and
   the socket that electrically connects to a DUT and attaches to the interposer, wherein the first contactor of the socket is inserted into the first through hole of the substrate and has a first end that contacts the first terminal of the DUT, the second contactor of the socket contacts the first contact portion of the first conductive path and has a second end that contacts the second terminal of the DUT, the socket comprises a holding member that holds the first contactor and the second contactor such that the first end and the second end are on substantially the same virtual plane, the second contactor has a length shorter than a length of the first contactor, an air layer is formed between the holding member and the interposer, the holding member includes:
 a first body portion that is made of a resin material and that holds the first contactor; and
 a second body portion that is made of a metal material and that holds the second contactor, and the first conductive path of the interposer faces the second body portion via the air layer.

5. The socket assembly according to claim 4, wherein
the interposer further comprises a connector that is mounted on the substrate and that is connected to the first conductive path,
the substrate of the interposer has an exposed region exposed from the socket, and
the connector is disposed on the exposed region to be on the same side of the substrate as the socket.

6. The socket assembly according to claim 4, wherein the interposer further comprises a circuit that is connected to the first conductive path.

7. A socket that electrically connects to a DUT, the socket comprising:
 a first contactor having a first end that contacts a first terminal of the DUT;
 a second contactor having a second end that contacts a second terminal of the DUT; and
 a holding member that holds the first contactor and the second contactor such that the first end and the second end are on substantially the same virtual plane, wherein
the second contactor has a length shorter than a length of the first contactor,
the socket further comprises an air layer former that forms an air layer between the holding member and an interposer,
the holding member includes:
 a first body portion that is made of a resin material and that holds the first contactor; and
 a second body portion that is made of a metal material and that holds the second contactor, and
the first conductive path of the interposer faces the second body portion via the air layer.

8. A wiring board assembly comprising:
 an interposer to be interposed between a socket and a wiring board; and
 the wiring board that attaches to the interposer, wherein
the wiring board comprises a second conductive path comprising a second contact portion,
the wiring board is a separate member from the interposer and detachably attaches to the interposer,
the interposer comprises:
 a substrate having a first through hole into which a first contactor of the socket is inserted; and
 a first conductive path disposed on the substrate,
the first conductive path comprises a first contact portion that contacts a second contactor of the socket, and
the second contact portion faces the first through hole of the interposer.

9. The wiring board assembly according to claim 8, wherein
the wiring board assembly further comprises the socket that attaches to the wiring board via the interposer,
a first contactor of the socket is inserted into the first through hole of the interposer, contacts the second contact portion of the wiring board, and has a first end that contacts the first terminal of the DUT,
a second contactor of the socket contacts the first contact portion of the interposer and has a second end that contacts the second terminal of the DUT,
the socket comprises a holding member that holds the first contactor and the second contactor such that the first end and the second end are on substantially the same virtual plane, and
the second contactor has a length shorter than a length of the first contactor.

10. The wiring board assembly according to claim 9, wherein an air layer is formed between the holding member and the interposer.

11. The wiring board assembly according to claim 10, wherein
the holding member includes:
 a first body portion that is made of a resin material and that holds the first contactor; and
 a second body portion that is made of a metal material and that holds the second contactor, and
the first conductive path of the interposer faces the second body portion via the air layer.

12. The wiring board assembly according to claim 9, wherein
the interposer further comprises a connector that is mounted on the substrate and that is connected to the first conductive path,
the substrate of the interposer has an exposed region exposed from the socket, and
the connector is mounted on an opposite main surface opposite to a main surface that faces the wiring board in the exposed region.

13. The wiring board assembly according to claim 8, wherein
the interposer further comprises a connector that is mounted on the substrate and that is connected to the first conductive path, and
the wiring board has a second through hole into which the connector is inserted.

14. The wiring board assembly according to claim 8, wherein
the interposer further comprises a connector that is mounted on the substrate and that is connected to the first conductive path,
the connector is mounted on an opposite main surface opposite to a main surface that faces the wiring board in the substrate of the interposer, and
the substrate has a third through hole into which the connector is inserted.

15. The wiring board assembly according to claim 8, wherein the interposer further comprises a circuit that is connected to the first conductive path.

\* \* \* \* \*